United States Patent [19]
Sotokubo

[11] Patent Number: 5,936,420
[45] Date of Patent: Aug. 10, 1999

[54] SEMICONDUCTOR INSPECTING APPARATUS

[75] Inventor: Yasunori Sotokubo, Zama, Japan

[73] Assignee: Kabushiki Kaisha Toshiba, Kawasaki, Japan

[21] Appl. No.: 08/828,061

[22] Filed: Mar. 28, 1997

[30] Foreign Application Priority Data

Mar. 29, 1996 [JP] Japan .................................... 8-077802

[51] Int. Cl.⁶ ................................................ G01R 1/067
[52] U.S. Cl. ........................................... 324/759; 324/758
[58] Field of Search .................................. 324/754, 758, 324/759, 763, 765

[56] References Cited

U.S. PATENT DOCUMENTS

| | | | |
|---|---|---|---|
| 4,786,867 | 11/1988 | Yamatsu | 324/758 |
| 4,965,515 | 10/1990 | Karasawa | 324/759 |
| 4,985,676 | 1/1991 | Karasawa | 324/754 |
| 5,521,522 | 5/1996 | Abe et al. | 324/758 |

*Primary Examiner*—Glenn W. Brown
*Attorney, Agent, or Firm*—Foley & Lardner

[57] ABSTRACT

The semiconductor inspecting apparatus can inspect a semiconductor device on which a plurality of product chips and a single TEG (test element group) chip are formed in the same step. The semiconductor inspecting apparatus includes a stage (2) for mounting a semiconductor wafer (1) on which product chips (A) and TEG chips (T) for inspecting the characteristics of the product chips (A) are arranged repeatedly; and a prober (3) for inspecting the defectiveness or non-defectiveness of each product chip and further printing an inspection result mark on the inspected product chip, respectively, when the stage is moved or scanned relative to the probe. The semiconductor inspecting apparatus is characterized in that a plurality of the product chips and a single TEG chip are formed on the semiconductor chip at the same step; and in that the apparatus further comprises a stage control section (4) for setting a number of length units selected from a length unit of a unit block, a length unit of the product chip, a length unit of the TEG chip, and combinations of these length units, as a movement unit of the stage, and for controllably moving the stage on the basis of the set length unit.

15 Claims, 14 Drawing Sheets

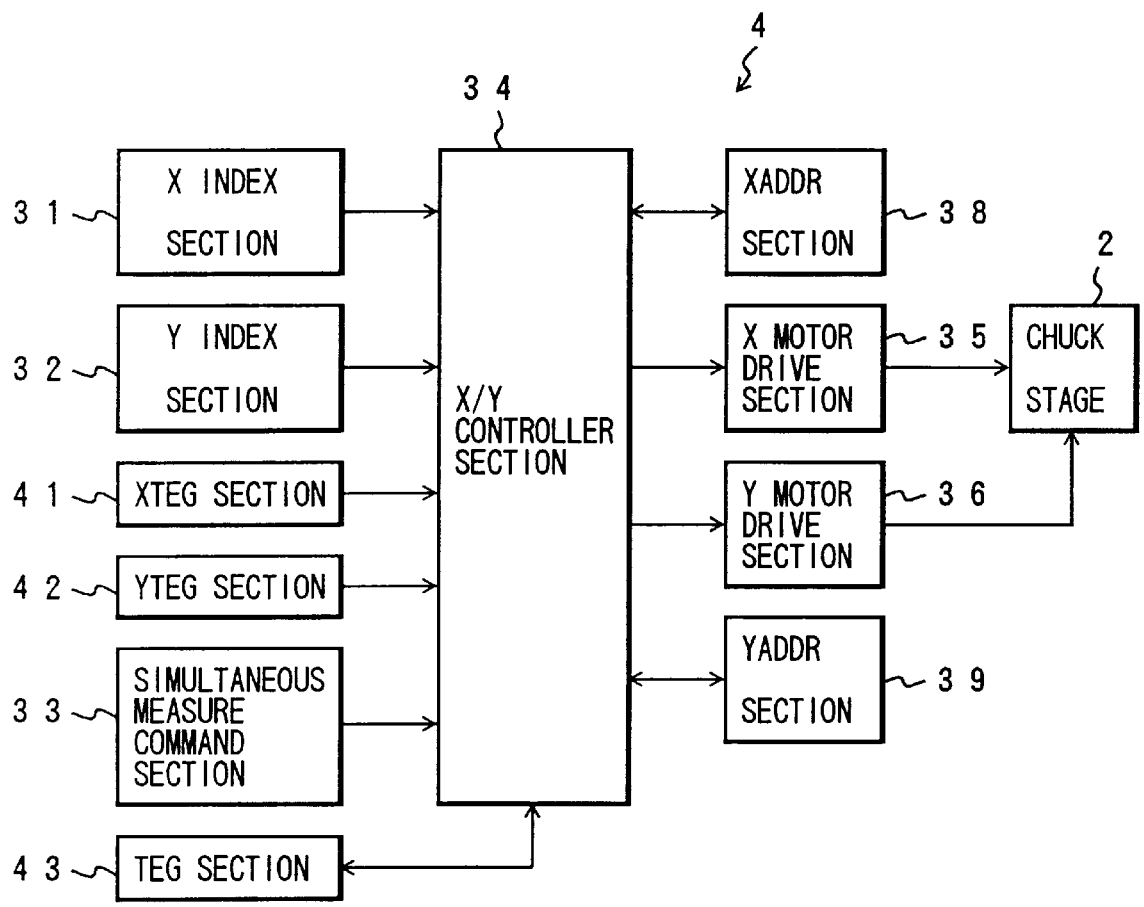
F I G . 2

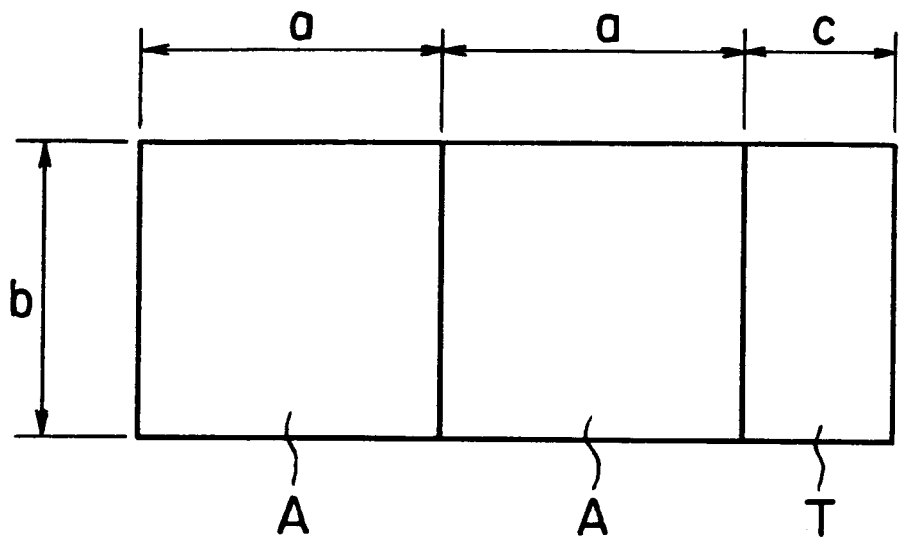
F I G. 6

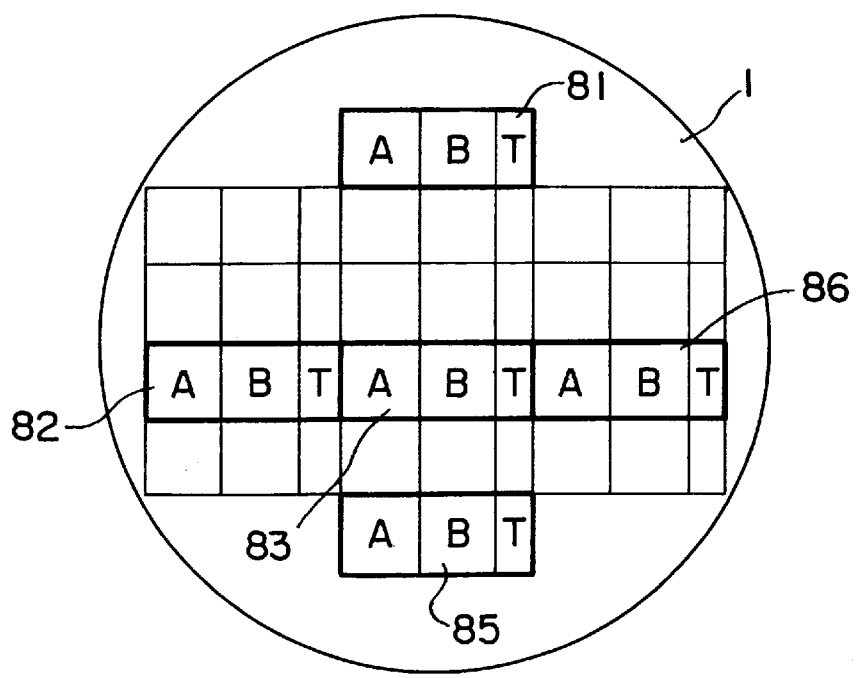
F I G. 11

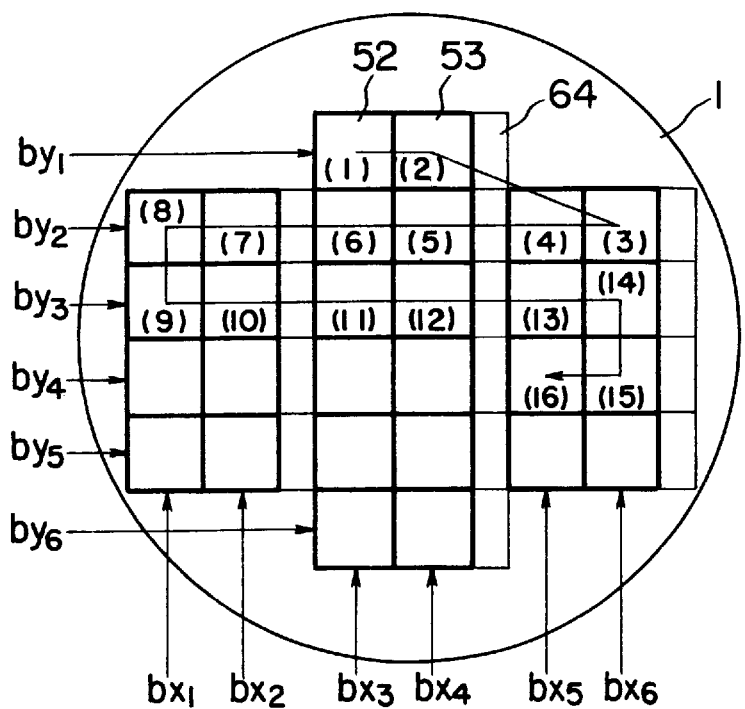
F I G. 13

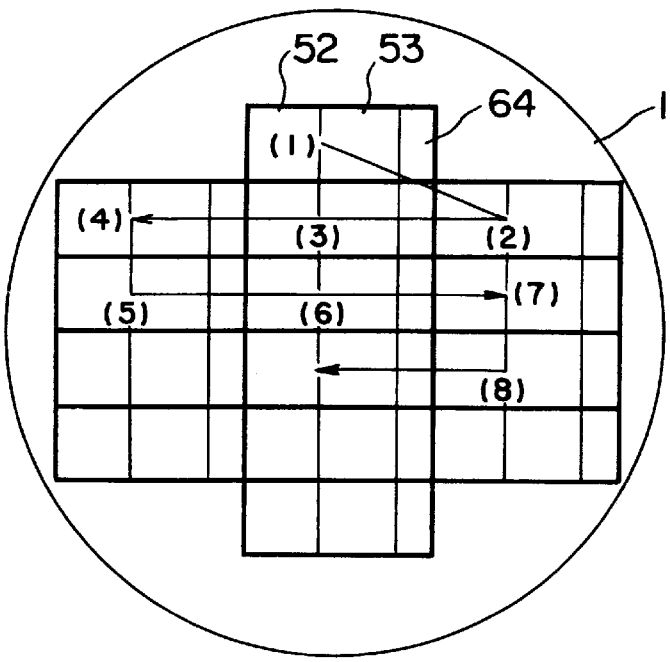
F I G. 15

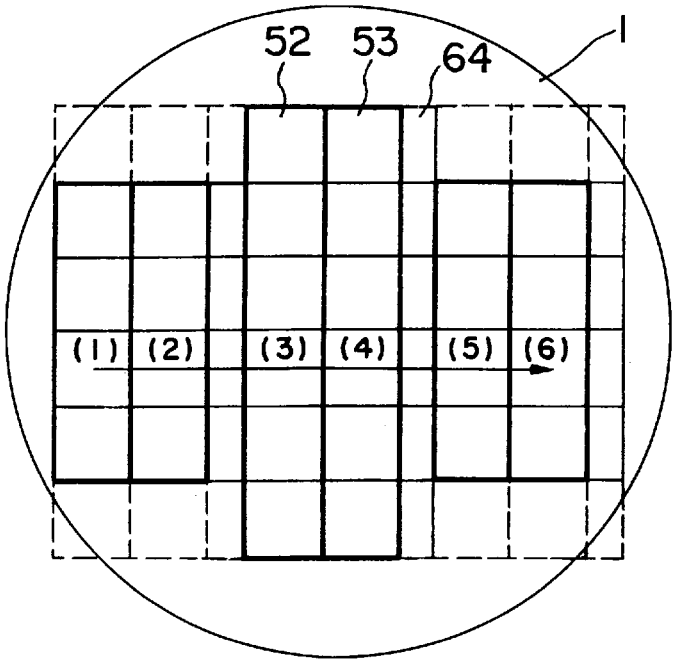
F I G. 19

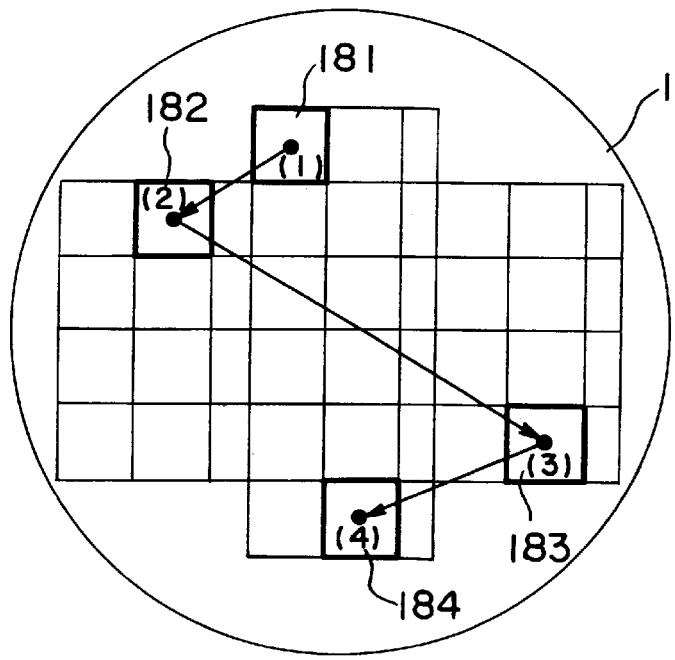
F I G. 21

SEMICONDUCTOR INSPECTING APPARATUS

BACKGROUND OF THE INVENTION

1. Field of the Invention

The present invention relates to semiconductor inspecting apparatus used to inspect a semiconductor wafer, and more specifically to a semiconductor inspecting apparatus such as a wafer prober apparatus for inspecting electric characteristics of semiconductor chips (e.g., product chips and TEG (test element group) chips) arranged repeatedly on a semiconductor wafer.

2. Description of the Prior Art

On a semiconductor wafer, a plurality of product chips manufactured as products are formed and arranged repeatedly. These product chips are manufactured by exposing one product chip or a plurality of product chips in a single step. Further, the product chips are provided whenever the semiconductor wafer is moved, to manufacture the product chips all over the surface of the semiconductor wafer.

Further, all the manufactured product chips are 100%-tested on the semiconductor wafer individually by use of a semiconductor inspecting apparatus. The inspection results, that is, the defectiveness or the non-defectiveness is recorded for each product chip for each predetermined inspection item.

The prior art method of inspecting the semiconductor wafer by use of a prober apparatus will be explained hereinbelow with reference to the attached drawings.

FIG. 4 shows two product chips A and B each having a horizontal chip size of "a" and a vertical chip size of "b", and FIG. 7 shows a semiconductor wafer 1 on which a plurality of these product chips A and B are arranged. In FIG. 7, the product chips A and the product chips B are printed simultaneously on the same semiconductor wafer 1 at a single printing step. Here, although the two product chips A and B are different from each other, since the chip sizes "a" and "b" are equal to each other, these two chips can be considered as being equivalent to each other when inspected.

FIG. 1 shows a conventional stage control section. In FIG. 1, the horizontal chip size "a" and the vertical chip size "b" of the product chips A and B as shown in FIG. 4 are registered in an x-index section 31 and a y-index section 32, respectively. Further, the number and the arrangement order of product chips A and B (two chips in the case shown in FIG. 7) inspected at the same time are registered in a simultaneous inspection commanding section 33.

An X/Y control section 34 generates two movement control signals for controlling the movements of a chuck stage 2 on the basis of data inputted by the x-index section 31, the y-index section 32, and the simultaneous inspection commanding section 33. The two generated control signals are inputted to an X motor driving section 35 and a Y motor driving section 36, respectively. On the basis of these two movement control signals, the X motor driving section 35 and the Y motor driving section 36 control the movements of the chuck stage 2 in both the x-axis and y-axis directions.

The maximum movement distances are determined for the chuck stage 2. Therefore, within the maximum movement distances, the product chips must be arranged repeatedly on the semiconductor wafer 1.

An XADDR section 38 and a YADDR section 39 add index units (i.e., the movement units) of the chuck stage 2 in both x-axis and y-axis directions, respectively, and command the added results to an X/Y control section 34, respectively.

As a result, as shown in FIG. 7, it is possible to give the horizontal coordinate values of ax1 to ax6 and the vertical coordinate values of ay1 to ay6 to the product chips, in both the horizontal x-axis and the vertical y-axis directions, respectively. Here, since the movable range of the chuck stage 2 is divided into a lattice pattern in indexed units, each of the product chips can be allocated on the basis of the x-coordinate value and the y-coordinate value given to each section of the lattice pattern, respectively.

Further, the chuck stage 2 and the semiconductor wafer 1 are aligned in such a way that the movement directions of the chuck stage 2 match the arrangement directions of the lattice pattern of the semiconductor wafer 1 in both the directions. Further, after the alignment, five product chips 71 to 75 distributing as shown in FIG. 10 are all checked to determine whether these product chips have the same index unit or not. By this check, it is possible to confirm the alignment of both the x-axis and y-axis directions and further the chip size. Further, in FIG. 10, although the product chip (A) 72 is different from the other four product chips (B) 71, 73, 74 and 75 with respect to the contents of one shot, since the chip sizes of both the product chips A and B are the same with respect to each other, it is possible to align these two product chips A and B without causing any problems.

FIG. 12 shows an example of the movements of the chuck stage 2 after the alignment. The chuck stage 2 is controllably moved in unit of one chip size regularly beginning from a start point (1) (i.e., a product chip 52), through (2), (3), . . . , (14), (15), to the last point (16). These movement control can be executed by the XADDR section 38 and the YADDR section 39, by adding each unit of the chip sizes "a" and "b" in both the x-axis and y-axis directions, respectively.

In more detail, when the product chip 52 is moved in one index unit from the product chip 52 (X:ax3; Y:ay1) to the product chip 53 (X:ax4; Y:ay1) in the x-axis direction, the X-coordinate of each product chip changes by one index unit. In the same way, when the product chip 52 is moved in one index unit in the y-axis direction, the Y-axis coordinate of each product changes by one index unit.

Whenever the respective product chip is moved by the chuck stage relative to each inspection position by the prober, the electric characteristics of the product chip are measured. The inspection results (i.e., a non-defective products or a defective product) are stored in a memory for each product chip in combination with the coordinates of the product chips.

Further, a plurality of the product chips are measured at the same time as follows:

FIG. 14 shows an example of the operation for measuring two product chips at the same time. In this example, since two probers are arranged and further moved simultaneously, it is possible to measure the electric characteristics of the two product chips 52 and 53 at the same time. The stage 2 is moved from the product chip 52 (i.e., the starting point (1)) to the product chip 54 (i.e., the succeeding point(2)).

Here, since only one coordinate value is registered in each of the XADDR section 38 and the YADDR section 39, respectively, it is possible to index another chip coordinate relatively on the basis of the data given by the simultaneous measurement commanding section 33.

In the example shown in FIG. 14, it is registered in the simultaneous measurement commanding section 33 that there are two product chips to be measured at the same time relative to the product chip 52 located at the reference position and further that one (e.g. 53) of the two product chips measured at the same time is located on the right side of the other (e.g., 52) of the two product chips.

In response to the commands of the simultaneous measurement commanding section 33, the X/Y control section 34 moves the chuck stage 2 in block unit obtained by grouping a plurality of the simultaneous measurements (two in the case shown in FIG. 4) as one block, because the two chips are grouped as one block in this example.

The measurement results are stored in the memory in combination with the coordinates of each chip, in the same way as when the chips are measured one by one.

FIG. 16 shows an example of the movements of the chuck stage, when six product chips (two in the x-axis direction and three in the y-axis direction) are measured at the same time.

In this example, when the simultaneous measurement is registered by setting the product chip 52 (132) as the reference chip, the stage is moved to the lattice areas 131 and 132 in which the product chips are not formed in practice. Further, in this example, both the XADDR section 38 and the YADDR section 39 designate the coordinates of the two lattice areas 131 and 133 where no practical product chips are formed. In the same way as with the case of the two simultaneous measurements, individual coordinates are allocated to each of the remaining five product chips on the basis of the coordinates of the reference product chip (e.g., 52).

The measurement results are stored in the memory in combination with the coordinates of each product chip, in the same way as when the product chips are measured one by one.

FIG. 19 shows the case where six product chips arranged in a y-axis line are measured at the same time. The simultaneous measurements are basically the same as with the case where the product chips are measured one by one, or two by two, or six (=2×3) by six, so that any detailed description thereof is omitted herein.

FIG. 20 shows an example of the operation for printing a defective mark (e.g., ink mark) on each of the product chips registered as being defective after the end of the electrical measurements. In more detail, when the final product chip has been measured, the prober prints a mark on each of defective chip in the order of the registered defective chip data. In FIG. 20, since four defective chips 171, 172, 173 and 174 are found, the prober is moved to print a defective mark (i.e., an ink mark) in the order of (1), (2), (3) and (4).

FIG. 22 shows a prior art flowchart of controllably moving the chuck stage 2. By this flowchart, it is possible to decide the movement to the succeeding product chip and the number of chips to be moved. In more detail, in FIG. 22, the flowchart starts from [A] to move the chuck stage 2. In step ST10, if the present chip is not the final chip arranged in a row, in step ST11 the stage is moved by one index (one chip), and this subroutine ends at [B]. However, in step ST10, if the present chip is the final chip arranged in a row, in step ST12 the succeeding column is discriminated. If the discriminated column is the final column, since this indicates the final chip, the stage is not moved, ending the subroutine.

However, in step ST12, if the chip is arranged in a column other than the final column, in step ST13 the prober is moved to the succeeding chip, and row movement data n is loaded. Further, in step ST14, the column is moved by one index and further the row is indexed by n indices. Further, the movement direction is reversed and then the same procedure as above is repeated. When the prober movement ends, the subroutine ends at [B].

By the way, in order to inspect whether the product chips are defective or not during the manufacturing process, so-called TEG (test element group) chips are sometime formed and arranged in addition to the product chips. These TEG chips can achieve an important role, in particular at the early stage of development of the semiconductor device, because the production technology for newly developed product chips has not yet been established sufficiently or perfectly. The TEG chips must be formed on the semiconductor wafer at each step, whenever the product chips are manufactured.

FIG. 5 shows an example of the arrangement in which one product chip A and one TEG chip are printed at the same step. The horizontal width of the product chip A is "a", and the horizontal width of the TEG chip T is "c" which is different from "a". In the prior art method, as already explained, it has been necessary to arrange the TEG chips T in one-to-one correspondence to the product chips T, as shown in FIG. 5. This is because in the prior art wafer prober apparatus, the chuck stage 2 can be moved only in unit of one index. Therefore, in the prior art method, only when the TEG chips T and the product chips A are arranged adjacent to each other in one-to-one correspondence relationship with respect to each other or only when one product chip A and one TEG chip T are formed at the same step, the product chips A can be inspected.

In other words, in the prior art method, since the TEG chips T and the product chips A must be arranged adjacent to each other in one-to-one correspondence relationship as shown in FIG. 5, there exists a problem in that a great number of TEG chips must be formed on the semiconductor wafer.

Further, when one TEG chip T and a plurality of product chips A are formed at the same step as shown in FIG. 6, it has been so far impossible to inspect a plurality of the product chips by use of the prior art wafer prober apparatus.

Therefore, when a great number of TEG chips are arranged, after the production technology of the newly-developed chips has been established perfectly, there arises a problem in that the number of the product chips is inevitably reduced, because the product chips are formed in a narrowed area on the same semiconductor wafer. For instance, in the case shown in FIG. 5, roughly twice the area is required for the TEG chips, as compared with the case as shown in FIG. 6. Further, the number of the steps required to form a predetermined number of product chips is also doubled.

Recently, however, there exists such a tendency that the size of the product chips increases. Therefore, there exists a need of increasing the area usable for forming the product chips in a limited area on a semiconductor wafer, while decreasing the area occupied by the TEG chips.

Further, in the prior art method, when the TEG chips 64 are formed as shown in FIG. 9, since the shot area increases on the semiconductor wafer, the number of the product chips 52 and 53 to be formed on the semiconductor wafer decreases, as compared with the case where the TEG chips are not formed as shown in FIG. 7. For instance, when the two cases shown in FIGS. 7 and 9 are compared with each other, there exists a difference of four chips between the two. In other words, since the number of chips that can be formed on a semiconductor wafer decreases, the number of the semiconductor wafers required to manufacture a predetermined number of product chips increases. In addition, since all the TEG chips 64 are not effective, that is, since the inspection data cannot be obtained at both the right and left ends of the chips, there exists a problem in that the inspection results cannot be analyzed perfectly.

Further, to overcome these problems, it is necessary to form a plurality of product chips A and one TEG chip T at the same step, as shown in FIG. 6, to minimize an increase of area required to form the TEG chips T. In addition, it is necessary to allow the wafer prober apparatus itself to inspect the product chips formed as shown in FIG. 6.

FIG. 6 shows the example where one block composed of two product chips A and one TEG chip T are formed at the same one step, in which the size of one step is determined as a dimension of (a+b+c) in the x-axis direction. Therefore, in this example, the dimension required for one TEG chip can be decreased by half. Further, when m-units of product chips A and one TEG chip T are formed at the same one step, it is possible to decrease the dimension required to form the TEG chip by 1/m.

SUMMARY OF THE INVENTION

With these problems in mind, therefore, it is the object of the present invention to provide a semiconductor inspecting apparatus for inspecting the semiconductor device, in which a plurality of product chips and one TEG chip are formed at the same one step.

To achieve the above-mentioned object, the present invention provides a semiconductor inspecting apparatus, comprising: a stage for mounting a semiconductor wafer on which product chips and TEG chips for inspecting characteristics of the product chips are arranged repeatedly; a prober for inspecting non-defectiveness or defectiveness of the product chips and further printing inspection results on the product chips, respectively; and stage control means for setting a predetermined length unit selected from a length unit of the product chip, a length unit of the TEG chip, and combinations of these length units, as a movement unit of said stage, and for controllably moving said stage on the basis of the predetermined length unit.

Further, the present invention provides a semiconductor inspecting apparatus, comprising: a stage for mounting a semiconductor wafer on which product chips and TEG chips for inspecting characteristics of the product chips are arranged repeatedly, a unit block composed of a plurality of product chips and zero or a single TEG chip being arranged repeatedly on the semiconductor chip; a prober for inspecting non-defectiveness or defectiveness of the product chips and further printing inspection results on the product chips, respectively; and stage control means for setting a predetermined length unit selected from a length unit of the unit block, a length unit of the product chip, a length unit of the TEG chip, and combinations of these length units, as a movement unit of said stage, and for controllably moving said stage on the basis of the predetermined length unit.

Further, it is preferable that said stage control means comprises an XTEG section for designating the length unit in a horizontal direction of the TEG chip.

Further, it is preferable that said stage control means comprises a YTEG section for designating the length unit in a vertical direction of the TEG chip.

Further, it is preferable that the unit block is formed at a single shot simultaneously.

Further, it is preferable that said stage control means comprises a TEG section for designating a plurality of construction parameters each for constructing the unit block.

Further, it is preferable that one of the construction parameters is a parameter for indicating the number of the product chips included in the unit block.

Further, it is preferable that one of the construction parameters is a parameter for indicating the number of the product chips arranged from a reference chip of the unit block to the TEG chip.

Further, it is preferable that one of the construction parameters is a parameter for indicating whether the TEG chips are arranged in a horizontal direction or a vertical direction relative to a position of the reference chip of the unit block.

Further, it is preferable that the TEG section designates effective-time designating parameters for designating a duration when the construction parameter is effective.

Further, it is preferable that one of the effective-time designating parameters is a parameter for designating that the construction parameters are effective only when said prober inspects non-defectiveness or defectiveness of the product chips, respectively.

Further, it is preferable that one of the effective-time designating parameters is a parameter for designating that the construction parameters are effective only when said prober prints the inspection results on the product chips, respectively.

Further, it is preferable that one of the effective-time designating parameters is a parameter for designating that the construction parameters are effective both when said prober inspects non-defectiveness or defectiveness of the product chips, respectively and when said prober prints the inspection results on the product chips, respectively.

In the semiconductor inspecting apparatus according to the present invention, since there is provided the stage control means for controlling the movement of the stage in a predetermined length unit selected from a length unit of the product chip, a length unit of the TEG chip, and combinations of these length units, it is possible to controllably move the stage in such a way as to inspect the defectiveness or non-defectiveness of each product chip and further to print an inspection result mark on each product chip, with the result that the number of the TEG chips formed on the semiconductor wafer can be minimized.

Further, in the semiconductor inspecting apparatus according to the present invention, since there is provided the stage control means for controlling the movement of the stage in a predetermined length unit selected from a length unit of the unit block, a length unit of the product chip, a length unit of the TEG chip, and combinations of these length units, even in the case where unit blocks each composed of a plurality of the product chips and a single TEG chip are formed at the same single shot are arranged repeatedly on the same semiconductor wafer, it is possible to controllably move the stage in such a way as to inspect the defectiveness or non-defectiveness of each product chip and further to print an inspection result mark on each product chip, with the result that the number of the TEG chips formed on the semiconductor wafer can be minimized.

BRIEF DESCRIPTION OF THE DRAWINGS

FIG. 2 is a block diagram showing stage control means for controlling the stage of the semiconductor inspecting apparatus according to the present invention;

FIG. 6 is an illustration showing an example of the arrangement according to the present invention of two product chips and one-TEG chip formed at the same single shot, in which the unit block is composed of the two product chips and one TEG chip;

FIG. 11 is an illustration for assistance in explaining the alignment operation confirmation according to the present invention, which corresponds to FIG. 8;

FIG. 13 is an illustration showing an example of the stage movement operation of the wafer prober apparatus according to the present invention, which corresponds to FIG. 8;

FIG. 15 is an illustration showing an example of the stage movement operation according to the present invention for measuring two product chips simultaneously, which corresponds to FIG. 8;

FIG. 19 is an illustration showing an example of the stage movement operation according to the present invention for measuring one unit block composed of six product chips arranged in the y-axis direction at the same time;

FIG. 21 is an illustration showing an example of the operation according to the present invention for printing the inspection results;

DETAILED DESCRIPTION OF THE PREFERRED EMBODIMENTS

The semiconductor inspecting apparatus according to the present invention will be described hereinbelow with reference to the attached drawings.

Figure 3:
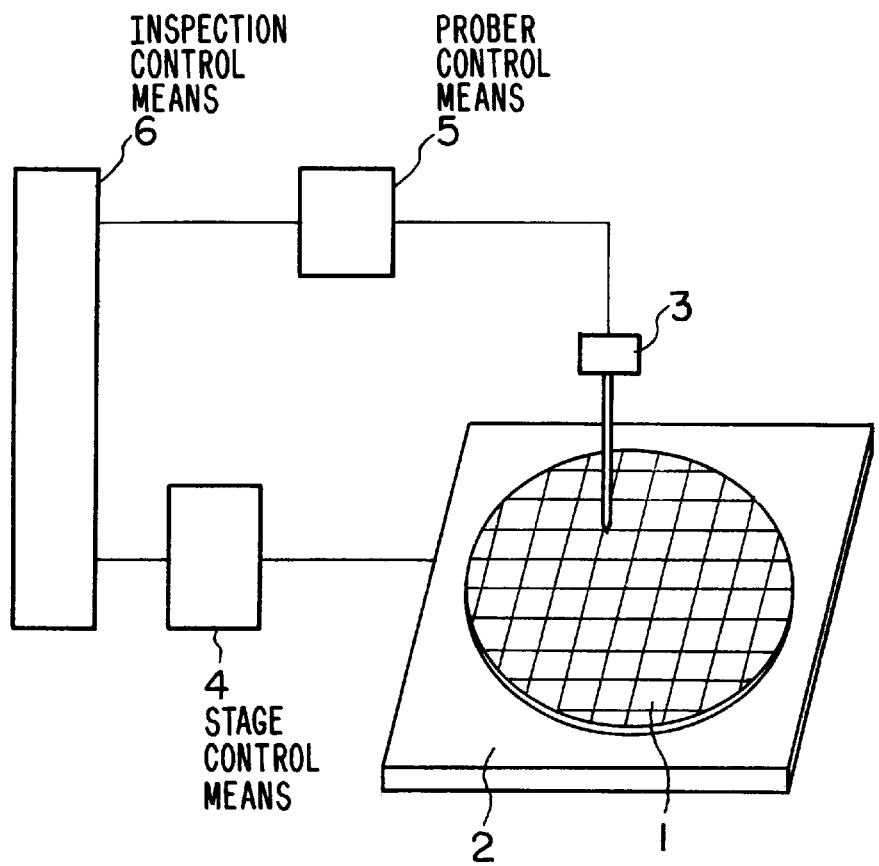
FIG. 3 is a block diagram showing a wafer prober apparatus, used as the semiconductor inspecting apparatus according to the present invention.
Figure 4:
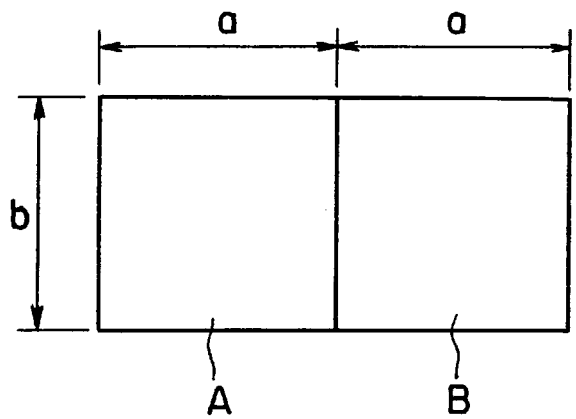
FIG. 4 is an illustration showing an example of the arrangement of two product chips formed at the same single shot.
Figure 5:
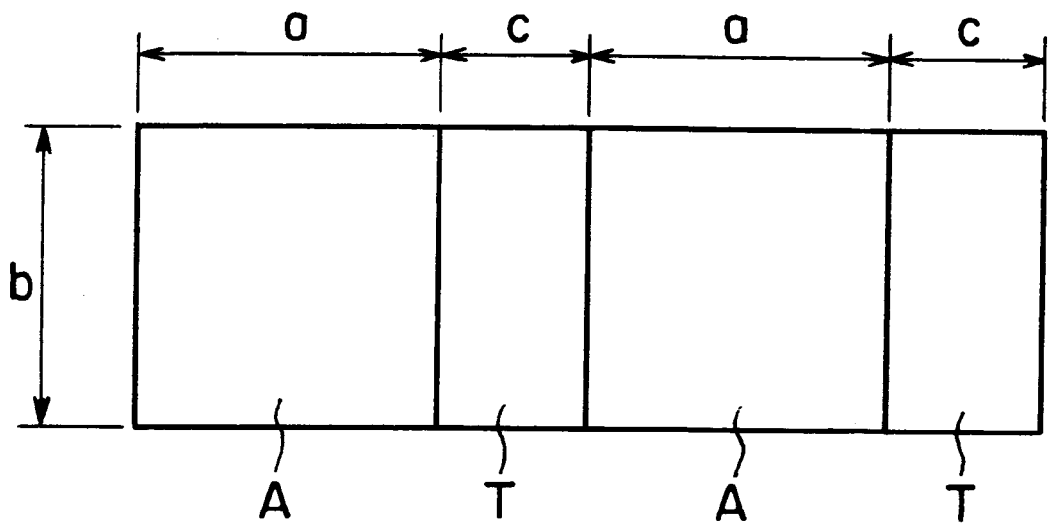
FIG. 5 is an illustration showing an example of the prior art arrangement of one product chip and one-TEG chip both formed at the same shot.

FIG. 3 is a block diagram showing a general construction of the wafer prober apparatus, that is, the semiconductor inspection apparatus according to the present invention. In FIG. 3, product chips and TEG chips are formed on a semiconductor wafer 1 in such a way that unit blocks each composed of two product chips A and one TEG chip T (e.g., as shown in FIG. 6) are arranged repeatedly thereon.

A chuck stage 2 is controllably moved by stage control means 4. On the other hand, a prober 3 is controlled by prober control means 5 to inspect the electric characteristics of the product chips A moved just under the prober 3. The stage control means 4 and the prober control means 5 are both controlled by inspection control means 6. Further, the inspection results of the prober 3 are recorded and further managed by the inspection control means 6.

Figure 1:
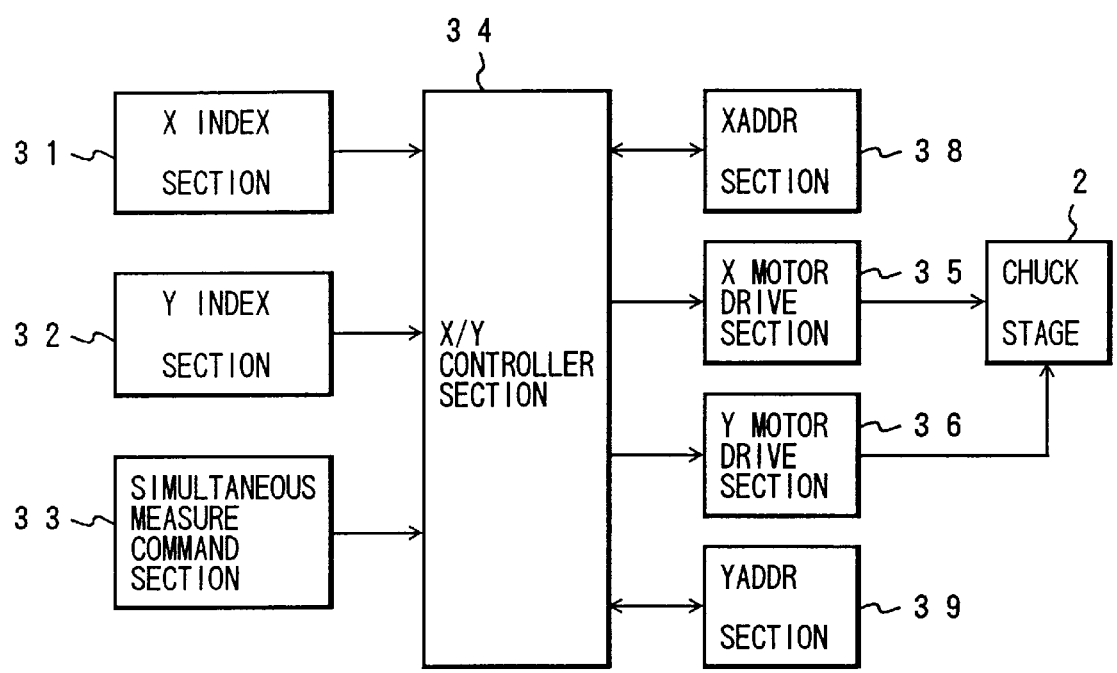
FIG. 1 is a block diagram showing stage control means for controlling the stage of a prior art waver prober apparatus.

Further, FIG. 2 is a block diagram showing the construction of the stage control means 4 according to the present invention, in which an XTEG section 41, a YTEG section 42, and a TEG section 43 are provided in addition to the construction of the prior art stage control means shown in FIG. 1.

Here, as shown in FIG. 6, the chip size of each product chip A is determined as "a"×"b", and the chip size of each TEG chip T is determined as "c"×"b". However, it is required to equalize the dimension of the product chip A to that of the TEG chip T at least in either one of the x-axis and y-axis directions.

The chip size "c" in the x-axis direction of the TEG chip T is given to the XTEG section 41 as an index, and the chip size "b" in the y-axis direction of the TEG chip T is given to the YTEG section 42 as an index. Therefore, both the XTEG section 41 and the YTEG section 42 command the X/Y control section 34 on the basis of these data.

On the other hand, the TEG section 43 commands the X/Y control section 34 by using data related to the TEG chip size as TEG parameters. On the basis of the command data transmitted from the XTEG section 41, the YTEG section 42 and the TEG section 43, the X/Y control section 34 calculates an index quantity necessary to control the alignment and the basic movement control of the chuck stage 2.

As the TEG parameters transmitted from the TEG section 43 to the X/Y control section 34, there are X/Y, nn and mm.

Here, the TEG parameter X/Y is used to designate a movement control pattern of the chuck stage 2. In more detail, the following facts can be designated by the X/Y value as set hereinbelow. When one TEG parameter X/Y value is selected from a plurality of the TEG parameter X/Y values set as described hereinbelow, it is possible to set any one of both the units of the product chip length and the block length, as the movement unit of the chuck stage 2. Further, when the inspection results are printed, it is possible to set the unit of the product chip length, as the movement unit of the chuck stage 2.

That is, X/Y=0 indicates that the TEG chips are not formed.

X/Y=1 indicates that the TEG chips are arranged in the X-axis direction. This set TEG parameter is effective only when the chuck stage 2 is moved for inspection and when moved for printing the inspection results (defective or non-defective products) on the product chips. This indicates that the chuck stage is moved based on the product chip.

X/Y=2 indicates that the TEG chips are arranged in the Y-axis direction. This set TEG parameter is effective in both when the chuck stage 2 is moved for inspection and when moved for printing the inspection results (defective or non-defective products) on the product chips. This indicates that the chuck stage is moved per the product chip.

X/Y=5 indicates that the TEG chips are arranged in the X-axis direction. This set TEG parameter is not effective when the chuck stage 2 is moved for inspection, but effective when moved for printing the inspection results (defective or non-defective products) on the product chips. This indicates that the chuck stage is moved per the block.

X/Y=6 indicates that the TEG chips are arranged in the Y-axis direction. This set TEG parameter is not effective in when the chuck stage 2 is moved for inspection, but effective when moved for printing the inspection results (defective or non-defective products) on the product chips. This indicates that the chuck stage is moved per the block.

Further, the above-mentioned TEG parameters X/Y are described only by way of example. When the other TEG parameter X/Y values are determined and further combined with each other, it is possible to set any value as the movement unit of the chuck stage 2. For instance, it is possible to use the following TEG parameter X/Y such as the unit of block length, the unit of product chip length, the unit of the TEG chip length, or any other desired length obtained by combining these units.

On the other hand, the TEG parameter nn indicates the number of product chips A included in a single unit of the grouped chips.

Further, the TEG parameter mm indicates the number of the product chips A arranged from the reference chip (e.g., the product chip arranged at the leftmost end in the x-axis direction or at uppermost end in the y-axis direction) to the TEG chip.

The TEG section 43 designates the sets of the TEG parameters X/Y, nn and mm as follows: In the following description, the set of the TEG parameters X/Y, nn and mm, the construction of the unit block indicated by the TEG parameter set, and the arrangement relationship between the product chip A and the TEG chip T will be explained. Further, three digits indicate the kinds of the sets of the three TEG parameters X/Y, nn and mm.

(1) When the three TEG parameters X/Y, nn and mm are 122, respectively, the chip arrangement is

A A T

This indicates that chips are arranged in the order of the product chip A, the product chip, and the TEG chip in the x-axis direction.

(2) When the three TEG parameters X/Y, nn and mm are 120, respectively, the chip arrangement is

T A A

This indicates that chips are arranged in the order of the TEG chip T, the product chip A and the product chip A in the x-axis direction.

(3) When the three TEG parameters X/Y, nn and mm are 152, respectively, the chip arrangement is

A A T A A A

This indicates that chips are arranged in the order of the product chip A, the product chip A, the TEG chip T, the product chip A, and the product chip A in the x-axis direction.

(4) When the three TEG parameters X/Y, nn and mm are 222, respectively, the chip arrangement is

A
A
T

This indicates that chips are arranged in the order of the product chip A, the product chip, and the TEG chip in the y-axis direction.

Here, an example will be explained with reference to FIG. 6. In this chip arrangement shown in FIG. 6, the three TEG parameters X/Y, nn and mm of the unit block are 122.

Further, an index "a" is given to the X index section 31; an index "b" is given to the Y index section 32; an index "c" is given to the XTEG section 41; and an index "b" is given to the YTEG section 42. Therefore, the movement quantity in the actual operation is "2a+c" in the x-axis direction and "b" in the y-axis direction.

Figure 8:
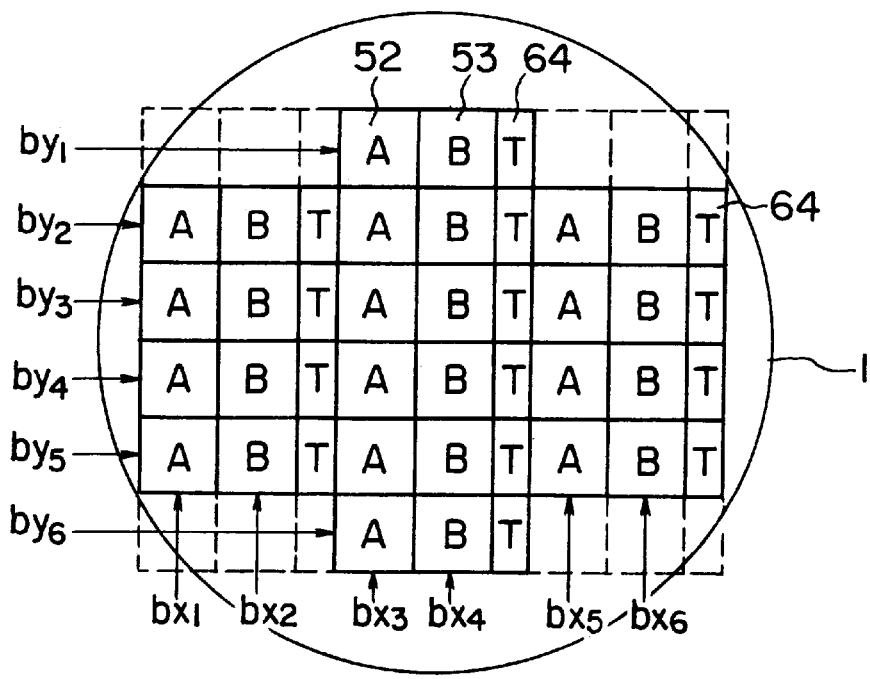
FIG. 8 is an illustration showing an example of the arrangement according to the present invention of the product chips and TEG chips formed on a semiconductor wafer, which corresponds to the chip arrangement shown in FIG. 6.
Figure 9:
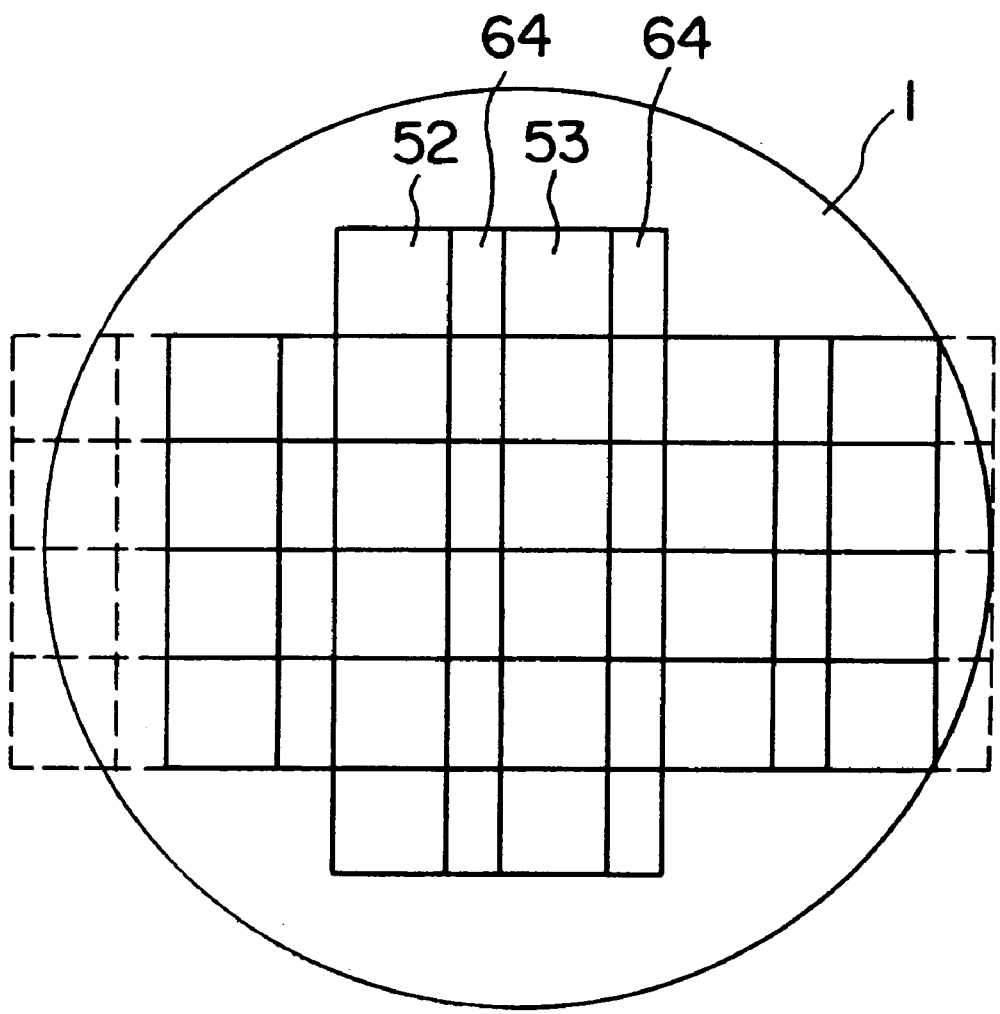
FIG. 9 is an illustration showing an example of the prior art arrangement of the product chip and TEG chip formed on a semiconductor wafer, which corresponds to the chip arrangement shown in FIG. 5.
Figure 10:
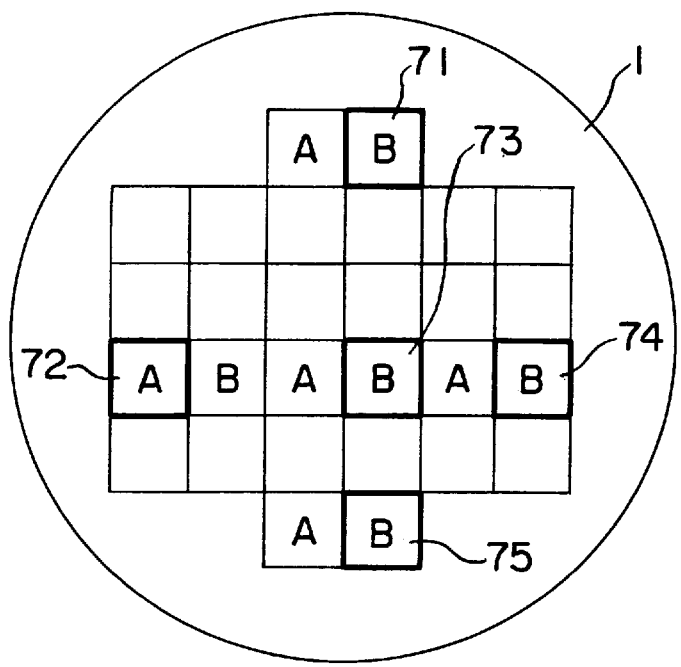
FIG. 10 is an illustration for assistance in explaining the prior art alignment operation confirmation executed in unit of chips, which corresponds to FIG. 7.
Figure 12:
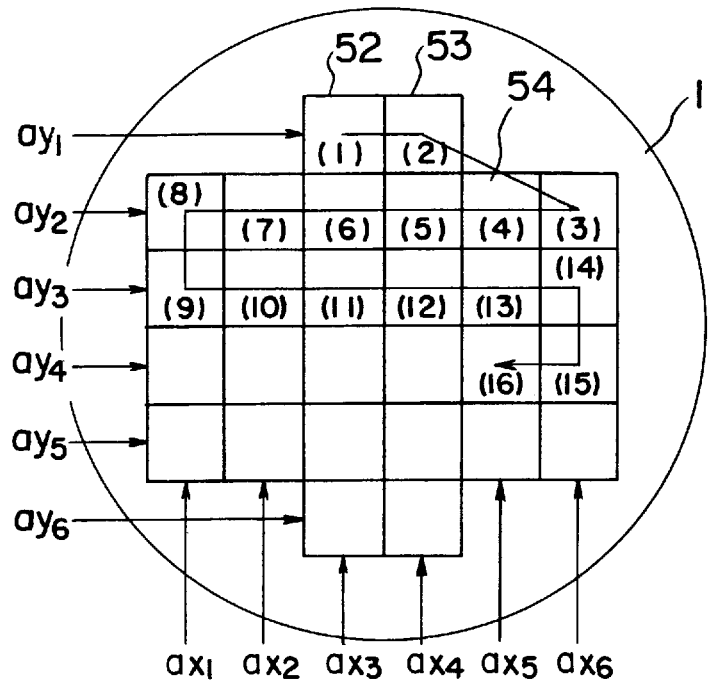
FIG. 12 is an illustration showing an example of the stage movement operation of the prior art wafer prober apparatus, which corresponds to FIG. 7.
Figure 14:
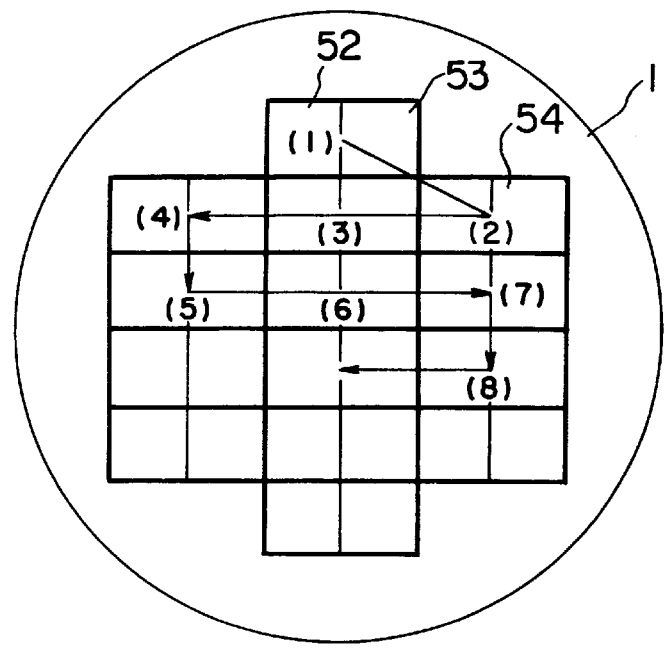
FIG. 14 is an illustration showing an example of the prior art stage movement operation for measuring two product chips simultaneously, which corresponds to FIG. 7.
Figure 16:
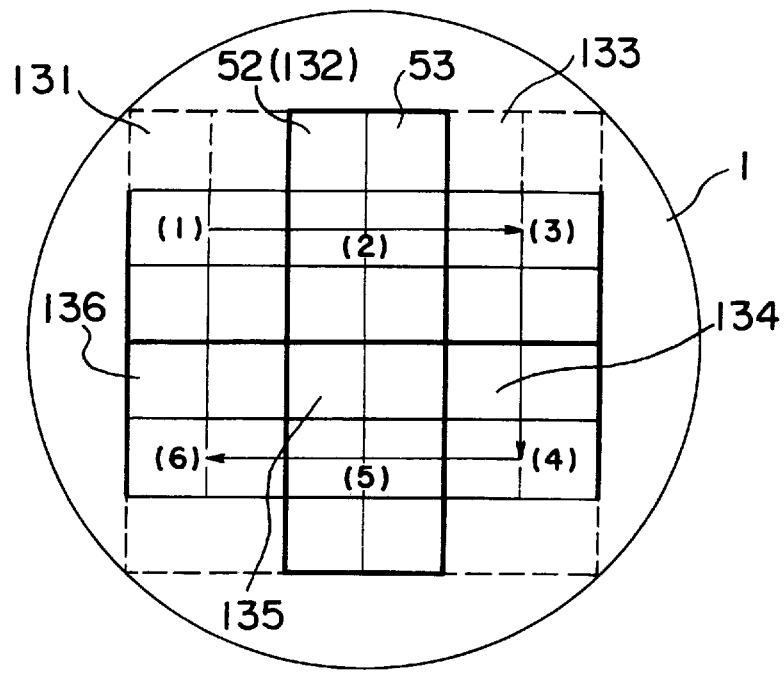
FIG. 16 is an illustration showing an example of the prior art stage movement operation for measuring one unit block composed of six product chips (two are arranged in the x-axis direction and three are arranged in the y-axis direction) at the same time.

FIG. 8 shows the chip arrangement on the semiconductor wafer, in which the chips of the unit block are formed at a single step at the same time.

Figure 7:
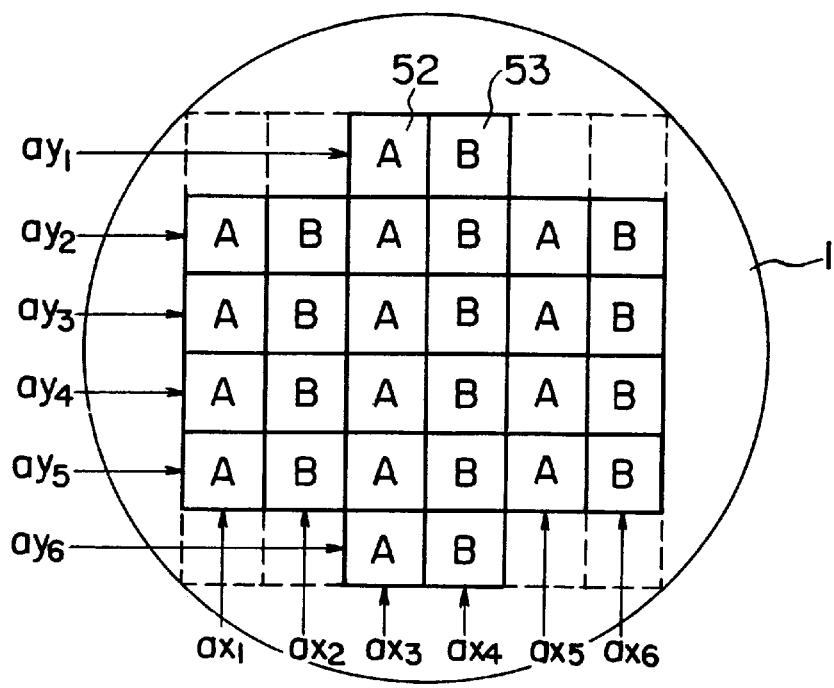
FIG. 7 is an illustration showing an example of the prior art arrangement of the product chips formed on a semiconductor wafer, which corresponds to the chip arrangement shown in FIG. 4.

On the basis of the three TEG parameters X/Y, nn and mm designated by the TEG section 43 and the chip sizes "a" and "b" of the product chips 52 and 53, individual different coordinates x and y are allocated to the product chips (A) 52 and the product chips (B) 53, respectively in the same way as with the case shown in FIG. 7.

FIG. 11 shows the positions of the product chips 81 to 85 extracted to confirm an appropriate chip arrangement on the wafer by the prober, whenever the chip alignment has been completed appropriately. Here, as shown in FIG. 6, each of the five unit blocks is composed of two product chips and one TEG chip. Therefore, it is possible to confirm the size of the unit block both in the x-axis and y-axis directions, by checking that all the five unit blocks are equal to each other.

FIG. 13 shows an example of the movement operation of the chuck stage 2 after the alignment has been completed. In this case, the three TEG parameters X/Y, nn and mm are set to 122, respectively. When these TEG parameters X/Y, nn and mm have been set as described above, it has been known that the alignment is executed in unit of block composed of two product chips 52 and 53 and one TEG chip 64, so that the product chips are inspected in unit of two products 52 and 53.

In FIG. 13, the chuck stage 2 is moved with regularity twice in unit of one chip size "a" of the product chip and once in unit of one chip size "c" of the TEG chip in the x-axis direction, from the start point (1), through (2), (3), . . . , (14), (15), (16), . . . , to the final chip. Further, the chuck stage 2 is moved at both ends on the x-axis in unit of one chip size "b" of the TEG chip, in the y-axis direction.

In this case, the coordinates designated by the XADDR section 38 and the YADDR section 39 change whenever the chip is moved. That is, the coordinates of each chip change to the adjacent chip coordinates, whenever the product chip is moved by one chip in the x-axis direction from a position (X:bx3, Y:by1) of the product chip 52 to another position (X:bx4, Y:by1) of the product chip 53. In the same way as above, in the y-axis direction, the coordinates of each chip change to the adjacent chip coordinates, whenever the product chip is moved by one chip.

The inspection results (defective or non-defective products) are stored in a memory in combination with the coordinates of each product chip, in the same way as with the case of the prior art method.

FIG. 15 shows an example of the simultaneous measurement of two product chips. In this simultaneous inspection, the electric characteristics of the two product chips can be measured simultaneously in unit of unit block. The chuck stage 2 is moved beginning from the start point (1) of the unit block (the same as that shown in FIG. 13), through (2), (3), . . . , (14), (15), (16), . . . . Here, coordinate values of only one chip are registered in the XADDR section 38 and the YADDR section 39, respectively. On the basis of the data of the simultaneous measurement commanding section 33, it is possible to know the coordinates of the other chips relatively.

Figure 17:
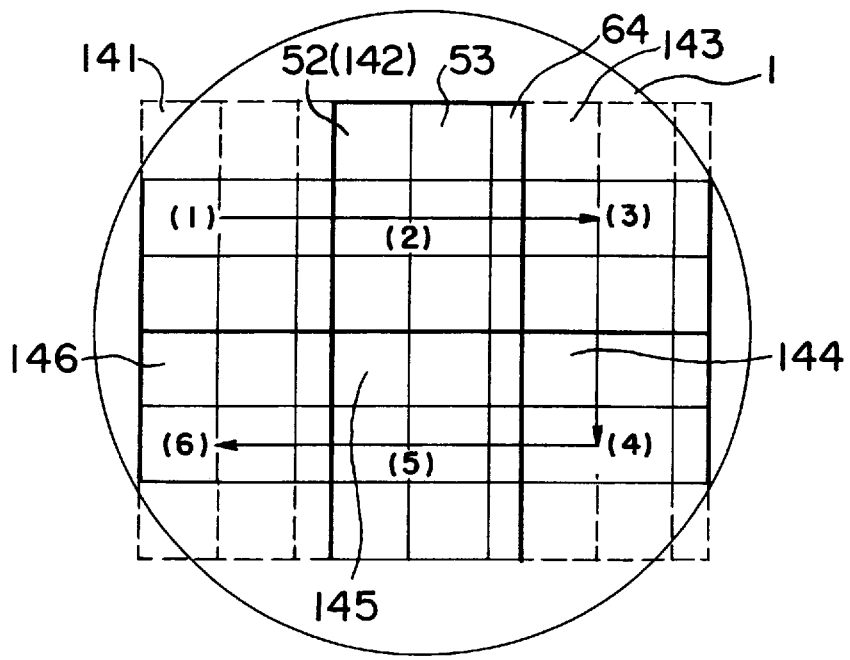
FIG. 17 is an illustration showing an example of the stage movement operation according to the present invention for measuring one unit block composed of six product chips (two are arranged in the x-axis direction and three are arranged in the y-axis direction) at the same time.
Figure 18:
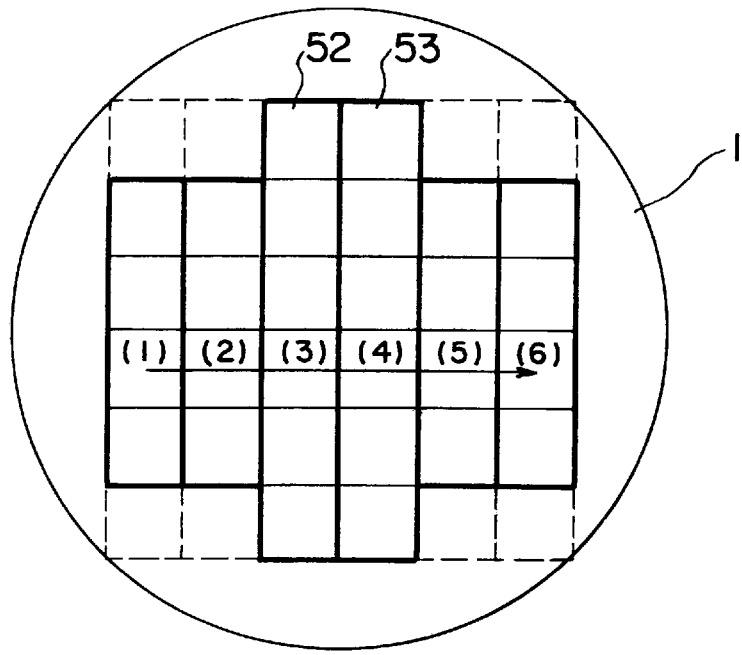
FIG. 18 is an illustration showing an example of the prior art stage movement operation for measuring one unit block composed of six product chips arranged in the y-axis direction at the same time.
Figure 20:
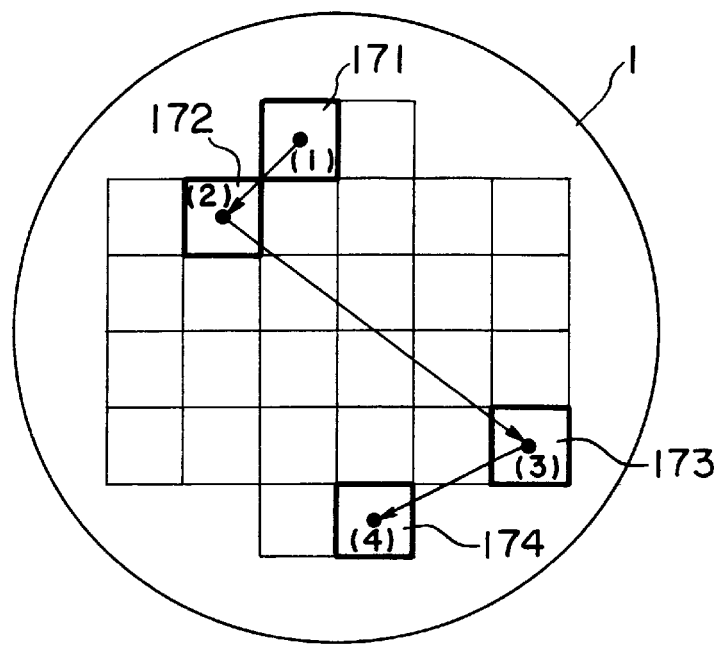
FIG. 20 is an illustration showing an example of the prior art operation for printing the inspection results.

FIG. 17 shows an example of the movement operation of the chuck stage 2 required when six product chips (two chips are arranged in the x-axis direction and three are arranged in the y-axis direction) are measured at the same time.

FIG. 19 shows an example of the movement operation of the chuck stage 2 required when six product chips (all chips are arranged in the y-axis direction) are measured at the same time.

FIG. 21 shows an example of the operation for printing a defective mark (e.g., ink mark) on each of the chips registered as being defective after the electric measurements.

In FIG. 21, after the measurement of the final chip has been completed, the prober 3 prints a mark (e.g., ink mark) on the defective product chip in the order of the registered sequence of the defective product chip data. In the case shown in FIG. 21, since the defective chips are four chips of 181, 182, 183 and 184, the prober 3 is moved in the order of (1), (2), (3) and (4) to print a mark on each chip. Therefore, as shown in FIG. 21, it is possible to directly move the prober 3, by designating the coordinates of the defective chips on the basis of the TEG parameters X/Y, nn and mm given by the TEG section 43 and the coordinates of each product chip. Further, with reference to FIG. 19, after the prober has been moved to the reference chip (the product chip 52 in this case) of the reference block composed of the two product chips 52 and 53 and the TEG chip 64. when the defective mark is printed on either one or both of the product chips 52 and 53, it is possible to move the prober more smoothly.

Figure 22:
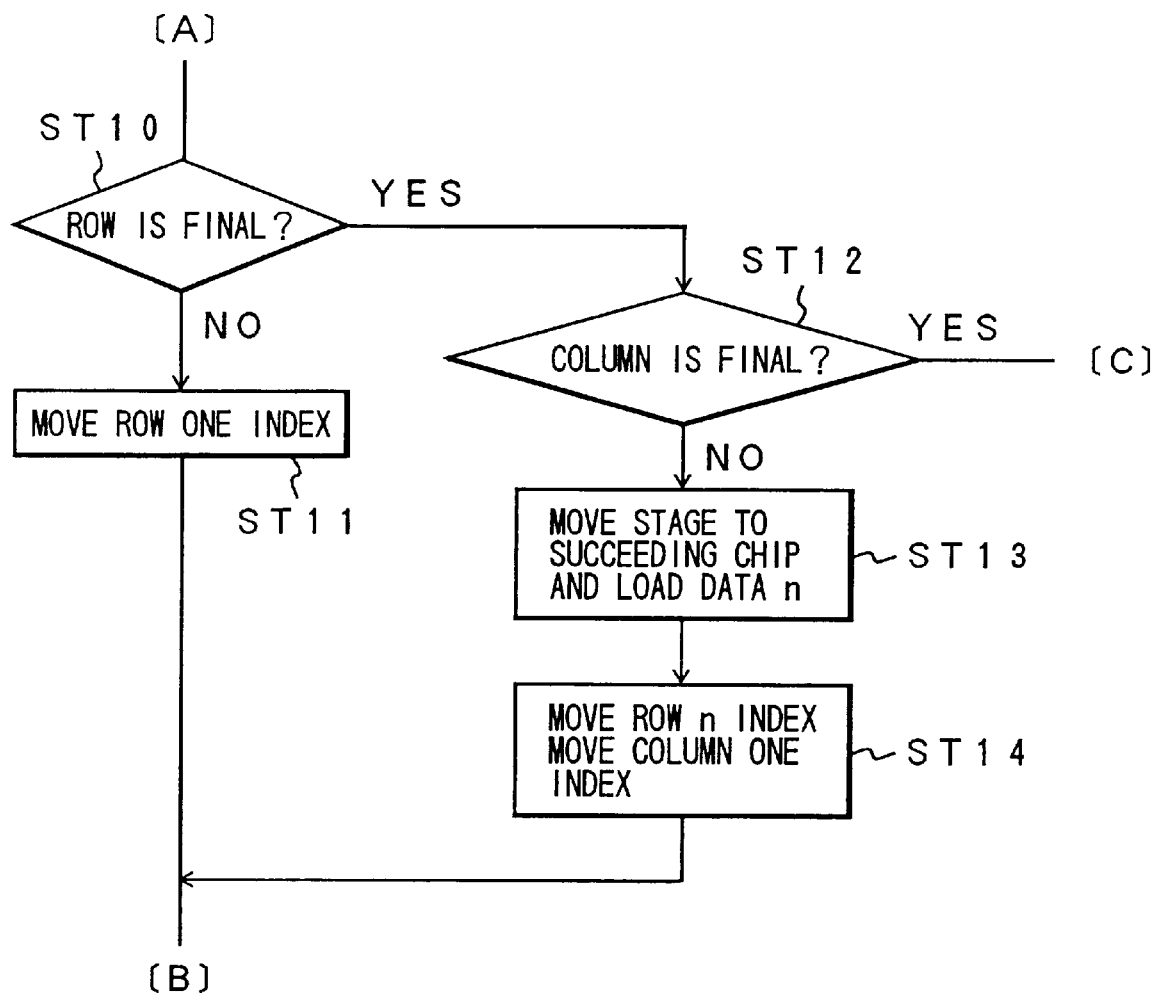
FIG. 22 is a flowchart for assistance in explaining the prior art stage movement control.
Figure 23:
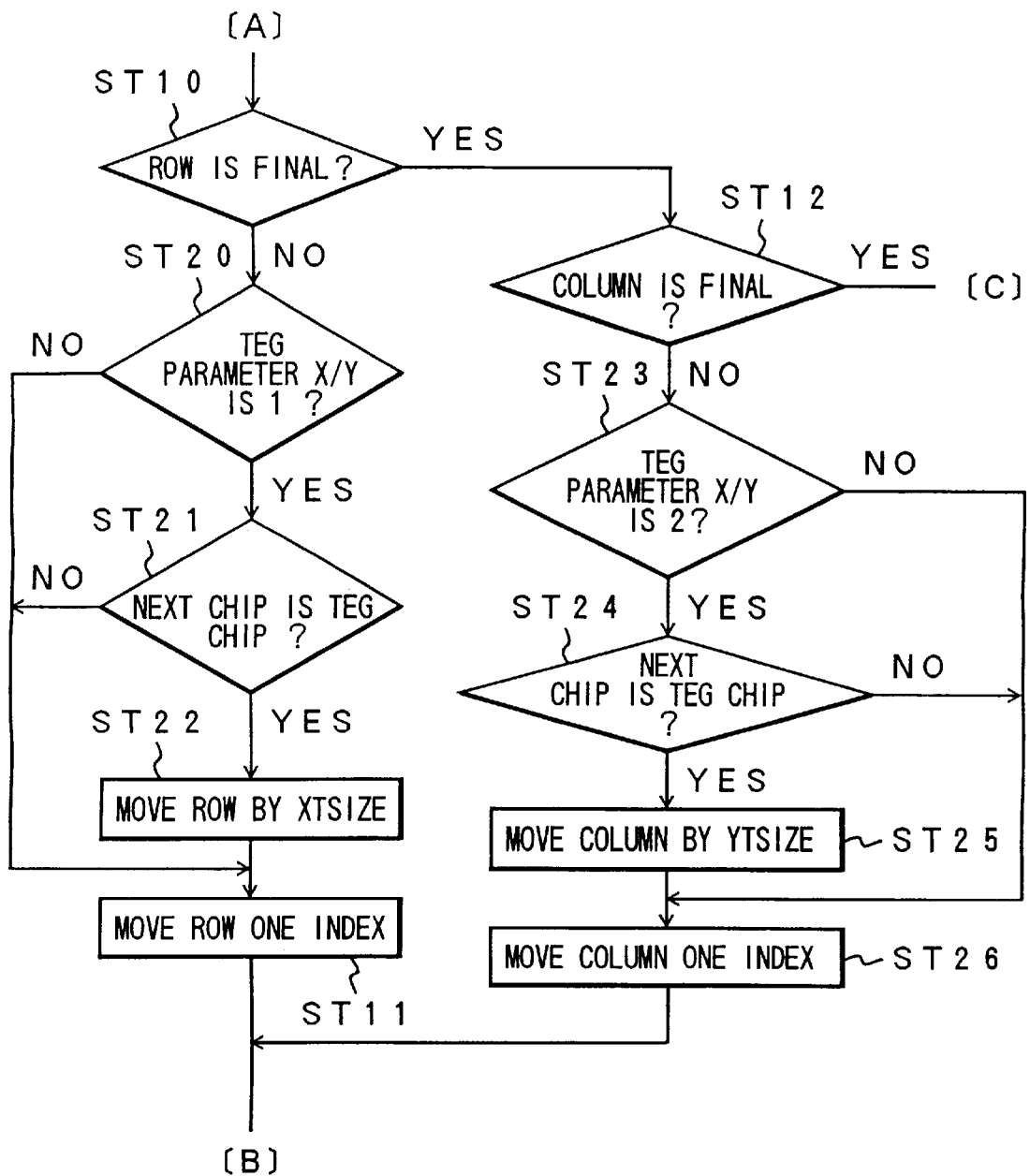
FIG. 23 is a flowchart for assistance in explaining the stage movement control according to the present invention.

FIG. 23 shows an example of the flowchart for controlling the movement of the chuck stage 2. In FIG. 23, the procedure of discriminating whether the TEG chip is present or absent is newly added to the prior art flowchart shown in FIG. 22. Since the first position at which the TEG chips is recognized differs in the horizontal or vertical movement direction according to the construction of the unit block, it is necessary to recognize the construction of the unit block.

First, the procedure is executed from [A] to move the chuck stage 2. In step ST10, if the chip is not the final chip arranged in a row, in step ST20, it is discriminated whether the TEG parameter X/Y is 1 or not. When the TEG parameter X/Y is 1, since this indicates that the TEG chip exists in the x-axis direction, in step ST21 it is discriminated whether the TEG chip exists at the succeeding movement position or not. In step ST21, when it is discriminated that the TEG chip exists at the succeeding movement position, the prober is moved by a stroke of the horizontal width value XTSIZE in the x-axis direction of the TEG chip (which is given by the XTEG section 41). Further, in step ST11, the row is moved by one index. On the other hand, when the TEG parameter X/Y is not 1 in step ST20 or when the TEG chip does not exist at the succeeding movement position in step ST21, the procedure proceeds to step ST11.

After the final chip has been measured, the prober prints a mark (e.g., an ink mark) on each of the defective chip in the order of the registered data sequence of the defective chips. In the case shown in FIG. 21, since the defective chips are four chips of 181, 182, 183 and 184, the prober 3 is moved in the order of (1), (2), (3) and (4) to print a mark on each chip.

In step ST10, if the chip is the final chip arranged in a row, in step ST12 it is discriminated whether the column is the last. When the column is not the last column, in step ST23 it is discriminated whether the TEG parameter X/Y is 2 or not. When the TEG parameter X/Y is 2, since this indicates that the TEG chip exists in the y-axis direction, in step ST24 it is discriminated whether the TEG chip exists at the succeeding movement position or not. In step ST24, when it is discriminated that the TEG chip exists at the succeeding movement position, the prober is moved by a stroke of the vertical width value YTSIZE in the y-axis direction of the TEG chip (which is given by the YTEG section 42). Further, in step ST26, the column is moved by one index. On the other hand, when the TEG parameter X/Y is not 2 in step ST23 or when the TEG chip does not exist at the succeeding movement position in step ST24, the procedure proceeds to step ST26, to move the row by one index.

As described above, in the semiconductor inspecting apparatus according to the present invention, since the stage control means 4 is provided with the XTEG section 41, the YTEG section 42 and the TEG section 43, it is possible to move or scan the chuck stage 2 in such a way that each product chip A can be inspected to find out a defective product and further marked with a defective mark as the result of the inspection, in such a semiconductor wafer 1 that a plurality of product chips A and a single TEG chip T are formed at a single step at the same time and further arranged continuously in per block.

In other words, since it is possible to inspect the product chips A formed on the semiconductor wafer on which the product chip A and the TEG chip T are not arranged in one-to-one corresponding relationship with respect to each other, it is possible to minimize the number of the TEG chips T formed on the semiconductor wafer, so that the number of the product chips A formed on the semiconductor wafer can be increased to that extent.

What is claimed is:

1. A semiconductor inspecting apparatus, comprising:
   a stage for mounting a semiconductor wafer on which product chips and TEG chips for inspecting characteristics of the product chips are arranged repeatedly;
   a prober for inspecting non-defectiveness or defectiveness of the product chips and further printing inspection results on the product chips, respectively; and
   stage control means for setting a plurality of length units selected from a length unit of the product chip, a length unit of the TEG chip, and combinations of these length units, as a movement unit of said stage, and for controllably moving said stage on the basis of the set length unit.

2. The semiconductor inspecting apparatus of claim 1, wherein said stage control means comprises a YTEG section for designating the length unit in a vertical direction of the TEG chip.

3. The semiconductor inspecting apparatus of claim 1, wherein said stage control means comprises an XTEG section for designating the length unit in a horizontal direction of the TEG chip.

4. A semiconductor inspecting apparatus, comprising:
   a stage for mounting a semiconductor wafer on which product chips and TEG chips for inspecting characteristics of the product chips are arranged repeatedly, a unit block composed of a plurality of product chips and zero or a single TEG chip being arranged repeatedly on the semiconductor chip;
   a prober for inspecting non-defectiveness or defectiveness of the product chips and further printing inspection results on the product chips, respectively; and stage control means for setting a plurality of length units selected from a length unit of the unit block, a length unit of the product chip, a length unit of the TEG chip, and combinations of these length units, as a movement unit of said stage, and for controllably moving said stage on the basis of the set length unit.

5. The semiconductor inspecting apparatus of claim 4, wherein the unit block is formed at a single step simultaneously.

6. The semiconductor inspecting apparatus of claim 4, wherein said stage control means comprises a TEG section for designating a plurality of construction parameters each for constructing the unit block.

7. The semiconductor inspecting apparatus of claim 6, wherein one of the construction parameters is a parameter for indicating the number of the product chips included in the unit block.

8. The semiconductor inspecting apparatus of claim 6, wherein one of the construction parameters is a parameter for indicating to the TEG chip the number of the product chips arranged relative to a reference chip in the unit block.

9. The semiconductor inspecting apparatus of claim 6, wherein one of the construction parameters is a parameter for indicating whether the TEG chips are arranged in a horizontal direction or a vertical direction relative to a position of the reference chip of the unit block.

10. The semiconductor inspecting apparatus of claim 6, wherein the TEG section designates parameters for designating a duration when the construction parameter is effective.

11. The semiconductor inspecting apparatus of claim 10, wherein one of the parameters is a parameter for designating that the construction parameters are effective only when said prober inspects non-defectiveness or defectiveness of the product chips, respectively.

12. The semiconductor inspecting apparatus of claim 10, wherein one of the parameters is a parameter for designating that the construction parameters are effective only when said prober prints the inspection results on the product chips, respectively.

13. The semiconductor inspecting apparatus of claim 10, wherein one of the parameters is a parameter for designating that the construction parameters are effective both when said prober inspects non-defectiveness or defectiveness of the product chips, respectively and when said prober prints the inspection results on the product chips, respectively.

14. The semiconductor inspecting apparatus of claim 4, wherein said stage control means comprises an XTEG section for designating the length unit in a horizontal direction of the TEG chip.

15. The semiconductor inspecting apparatus of claim 4, wherein said stage control means comprises a YTEG section for designating the length unit in a vertical direction of the TEG chip.

* * * * *